United States Patent
King et al.

[11] Patent Number: 6,008,073
[45] Date of Patent: Dec. 28, 1999

[54] METHOD OF MANUFACTURING A BUS BAR STRUCTURE ON LEAD FRAME OF SEMICONDUCTOR DEVICE PACKAGE

[75] Inventors: Jerrold L. King, Morgan Hill, Calif.; David J. Corisis, Meridian, Id.

[73] Assignee: Micron Technology, Boise, Id.

[21] Appl. No.: 09/168,498

[22] Filed: Oct. 8, 1998

Related U.S. Application Data

[62] Division of application No. 09/027,002, Feb. 20, 1998, Pat. No. 5,914,529.

[51] Int. Cl.$^6$ .............................. H01L 21/44; H01L 21/56
[52] U.S. Cl. .......................... 438/123; 438/124; 438/112; 438/127
[58] Field of Search ..................... 257/670, 672, 257/691, 692, 787; 438/112, 123, 124, 127, FOR 366, 369, 377, 379

[56] References Cited

U.S. PATENT DOCUMENTS

| | | | |
|---|---|---|---|
| 4,358,598 | 11/1982 | Chiu ........................................ | 156/634 |
| 5,013,871 | 5/1991 | Mahulikar et al. ..................... | 174/52.4 |
| 5,215,940 | 6/1993 | Orcutt et al. ............................ | 438/118 |
| 5,334,803 | 8/1994 | Yamamura et al. .................... | 174/52.4 |
| 5,532,189 | 7/1996 | Kiyono .................................... | 438/118 |
| 5,585,667 | 12/1996 | Asanasavest ............................ | 257/676 |
| 5,592,020 | 1/1997 | Nako et al. .............................. | 257/666 |
| 5,914,529 | 6/1999 | King et al. ............................... | 257/666 |

*Primary Examiner*—Olik Chaudhuri
*Assistant Examiner*—Alonzo Chambliss
*Attorney, Agent, or Firm*—Workman, Nydegger & Seeley

[57] ABSTRACT

A semiconductor device package is formed with a lead frame including a plurality of lead members positioned in an array on a first plane along a vertical or z-axis. A die paddle is attached to the lead frame adjacent to the lead members, and a semiconductor die having a plurality of bond pads is secured to the die paddle. A bus bar is provided on the lead frame, with the bus bar positioned between the lead members and the die paddle. A section of the bus bar passing by the lead members is offset from the first plane along the vertical axis. A plurality of connection members such as bonding wires traverses over the offset section of the bus bar to electrically couple the lead members to the semiconductor die. Other connection members electrically couple the offset section of the bus bar to the semiconductor die. The connection members coupled to the bus bar have a steeper incline than the connection members coupled to the lead members. The offset section of the bus bar provides additional clearance for bonding wires passing thereover, thus minimizing the possibility of wires shorting to the bus bar.

14 Claims, 3 Drawing Sheets

METHOD OF MANUFACTURING A BUS BAR STRUCTURE ON LEAD FRAME OF SEMICONDUCTOR DEVICE PACKAGE

This application is a divisional of U.S. patent application Ser. No. 09/027,002, filed Feb. 20, 1998, now U.S. Pat. No. 5,914,529 which is being incorporated herein by reference.

BACKGROUND OF THE INVENTION

1. The Field of the Invention

The present invention relates to semiconductor device packages. More particularly, the present invention relates to modified bus bar structures on lead frames of semiconductor device packages.

2. The Relevant Technology

The advancement of microprocessing technology has resulted in decreases in the physical size dimensions of semiconductor devices such as integrated circuit dies or chips. Such dimensional decreases requires corresponding decreases in the dimensions of semiconductor device packages, including a reduction in the size of lead frames and leads used in such packages.

In many semiconductor devices, a lead called a "bus bar" is used to distribute operating voltages to several contact areas on the semiconductor device, and to provide a ground bus to individual contact areas. The bus bar serves as an inner lead for supplying a power supply voltage (Vcc) and a reference voltage (Vss), or a ground, to the semiconductor chip. The bus bar is generally positioned so as to traverse the perimeter of the chip, and the bus bar is usually in the same general location or position as the inner lead finger tips. The bus bar can be connected to any point on the chip by short distance wire bonding to supply a voltage. Thus, the bus bar can be effectively employed to reduce noise and increase processing speed.

If the bus bar extends the length of the semiconductor device, the bonding wires between the lead fingers and the contact areas of the semiconductor chip must extend over the bus bar to provide electrical contact between the lead fingers and the contact areas. A problem that occurs in forming such semiconductor devices is that the bonding wires extending over the bus bar connecting the chip with the lead fingers can undesirably contact the bus bar, resulting in short circuiting between the bus bar and the bonding wires. For example, the bonding wires may fall or may be laterally pushed and deformed by a mechanical impact during the assembly process, or by the weight of such wires, resulting in undesirable contact. In addition, undesired contact of bonding wires may result from bonding wire sweep during the injection molding process from the pressure of an injected encapsulating material. The encapsulating material can move the delicate bonding wires which may, in turn, cause undesirable contact with the bus bar or other bonding wires, and thereby cause a short circuit.

If bonding wires are wired so as to form a larger loop in order to avoid contact with a bus bar, the wires become longer, thus increasing manufacturing costs. Furthermore, larger looping of bonding wires makes it more difficult to reduce the size and thickness of semiconductor devices.

In an attempt to solve the above problems, various techniques have been proposed for preventing short-circuiting due to the contact of two bonding wires or a bonding wire and a bus bar.

In U.S. Pat. No. 5,585,667 to Asanasavest, an integrated circuit package is disclosed in which a lead frame has closely spaced leads patterned in such a way that one or more bonding wires must cross over another lead in order to be bonded to its associated lead. The lead frame is modified in various ways such that the likelihood of electrical contact between the bonding wires and leads crossed over by the bonding wires is reduced. In one embodiment, a depression is formed on the adjacent lead such that additional clearance is created between the bonding wire and the adjacent lead, thus reducing the likelihood of electrical contact. In another embodiment, a stepped depression is formed on a lead at the point where the bonding wire bonds to the lead. The walls of the depression cause the inclination of the bonding wire to be at an increased incline such that additional clearance is created between the bonding wire and the adjacent leads to reduce the likelihood of electrical contact.

In another semiconductor device disclosed in U.S. Pat. No. 5,592,020 to Nakao et al., leads such as a pair of bus bars have alternating offset projections. In one embodiment, an elongated portion of one of the bus bars, excluding the bonding projections on the bus bar, is pushed downward away from the bonding wires. Consequently, the elongated portion excluding the projections is positioned lower than the surface of the bonding areas provided on the projections.

In U.S. Pat. No. 5,532,189 to Kiyono, recessed bus bar regions are etched in an elongated bus bar to accommodate location of bonding wires which couple the chip pads and associated inner leads for a lead-on-chip (LOC) semiconductor device. Fillets are formed of insulative adhesive material up about the bus bar region sides to thereby engage the bonding wires to prevent contact between the wires and the bus bar. In addition, bus bars have been upset or positioned above the die in LOC devices.

The above approaches are disadvantageous as being overly complicated and expensive. Accordingly, there is a need for improved bus bar structures that overcome or avoid the above problems.

SUMMARY OF THE INVENTION

The present invention is directed to a semiconductor device package utilizing modified bus bar structures on lead frames in order to minimize or prevent potential short circuiting of bonding wires that cross over the bus bar. The structure of the bus bars of the present invention minimizes the possibility of bonding wires making unwanted contact with the bus bar.

In one aspect of the invention, a semiconductor device package includes a lead frame with a plurality of lead members positioned in an array on a first plane along a vertical axis. A die paddle is attached to the lead frame adjacent to the lead members, and a semiconductor chip or die having a plurality of bond pads is secured to the die paddle. At least one bus bar is operatively connected to the lead frame, with the bus bar positioned between the lead members and the die paddle. A section of the bus bar passing by the lead members is offset from the first plane along the vertical axis. A first plurality of connection members such as bond wires traverses over the offset section of the bus bar to electrically couple the lead members to the semiconductor die. Other connection members electrically couple the offset section of the bus bar to the semiconductor die. The connection members coupled to the bus bar have a steeper incline than the connection members coupled to the lead members.

An encapsulating material is formed around the semiconductor die, the bus bar, the connection members, and an inner portion of the lead frame to provide a protective covering for the semiconductor device. The die paddle can be positioned on the first plane along the vertical axis, or the die paddle can be offset from the first plane along the vertical axis toward or beyond the offset section of the bus bar. The offset section of the bus bar is positioned on a second plane below or away from the semiconductor die.

In one preferred embodiment, a semiconductor device package according to the present invention includes a lead frame with a first array of lead fingers and a second array of lead fingers positioned on a first plane along a z-axis. A die paddle is attached to the lead frame and positioned between the first and second array of lead fingers. A semiconductor die is secured to the die paddle and includes a plurality of bond pads disposed on an outer surface thereof opposite the die paddle. A pair of bus bars is positioned between the lead fingers and the die paddle, with the bus bars including sections thereof passing by the lead fingers that are offset from the first plane to a second plane along the z-axis. A first plurality of bond wires traverses over the offset sections of the bus bars to electrically couple the lead fingers to the bond pads of the semiconductor die. A second plurality of bond wires electrically couples the offset sections of the bus bars to the bond pads of the semiconductor die. An encapsulating material is formed around the semiconductor die, the bus bars, the first and second plurality of bond wires, and an inner portion of the lead frame.

The offset sections of the bus bars provide additional clearance for bonding wires that are connected between the die bond pads and lead fingers of the lead frame, thus reducing the risk of wires shorting to the bus bars. The bus bars substantially surround the die, with the offset sections being downset away from the die so that bonding wires connected to the bus bars have a steeper angle of contact than bonding wires that are making contacts to lead fingers.

In another aspect of the invention, a method for fabricating a semiconductor device package includes forming a lead frame with a plurality of lead members such as lead fingers positioned in an array on a first plane along a vertical axis. A die paddle is attached to the lead frame adjacent to the lead members, and at least one bus bar is formed on the lead frame, with the bus bar positioned between the lead members and the die paddle. The bus bar is compressed or bent to produce a section thereof passing by the lead members that is offset from the first plane to a second plane along the vertical axis. A semiconductor die is secured to the die paddle. A first plurality of connection members such as bond wires are attached to the semiconductor die and the lead members such that the first plurality of connection members traverse over the offset section of the bus bar without contacting the bus bar. A second plurality of connection members is attached to the semiconductor die and the offset section of the bus bar such that the connection members attached to the bus bar have a steeper incline than the connection members attached to the lead members. The above components are then encapsulated with a protective material.

Other aspects and features of the present invention will become more fully apparent from the following description and appended claims, or may be learned by the practice of the invention as set forth hereinafter.

BRIEF DESCRIPTION OF THE DRAWINGS

In order to understand the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

The present invention is directed to a semiconductor device package such as an integrated circuit package in which bus bar structures on a lead frame are modified to reduce the likelihood of electrical contact by bonding wires that cross over the bus bars. The present invention is useful in semiconductor device package designs where lead fingers or tie bars are used to secure a bus bar to a lead frame and wires are required to go over the bus bar to connect other lead fingers to the semiconductor die. The bus bars are formed to have an offset section which provides additional clearance for bonding wires passing thereover that are connected between die bond pads and lead fingers of the lead frame. This reduces or eliminates the risk of wires shorting to the bus bars. The bus bars substantially surround the semiconductor die, with the offset section being downset below or away from the die so that bonding wires connected to the bus bars have a steeper angle of contact than bonding wires that are making contacts to lead fingers. The present invention thus minimizes the possibility of bonding wires making unwanted contact with the bus bars.

Figure 1:
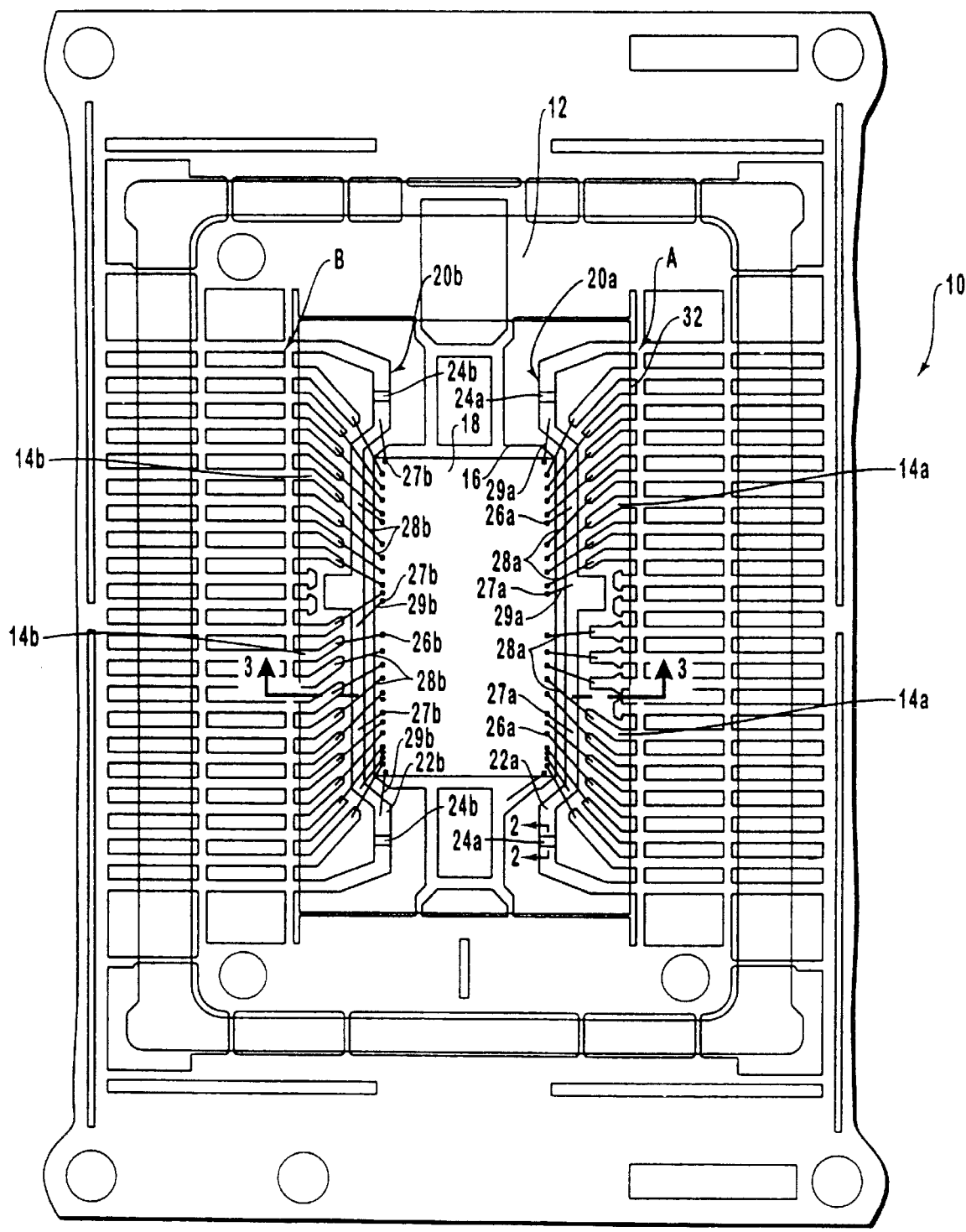
FIG. 1 is a plan view of a semiconductor device package according to one embodiment of the present invention.
Figure 2:
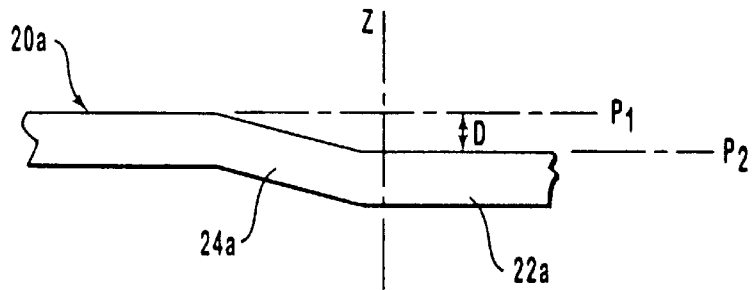
FIG. 2 is a cross-section reverse elevation view taken along line 2—2 of FIG. 1 depicting an offset section of a bus bar according to the present invention.
Figure 3:
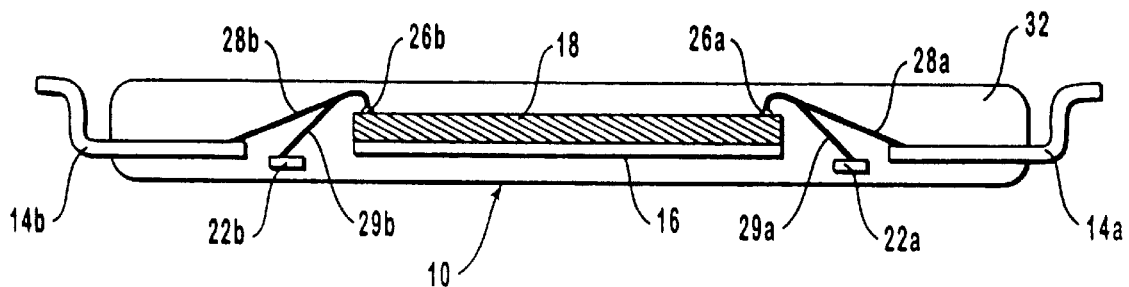
FIG. 3 is a cross-section reverse elevation view taken along line 3—3 of the semiconductor device package of FIG. 1.

Referring to FIGS. 1–3, a semiconductor device package 10 according to one embodiment of the present invention is depicted. The semiconductor device package 10 is a thin small outline package (TSOP) and includes a lead frame 12 formed of a conductive metal and having two opposing sides A and B with a plurality of external connections in the form of lead members disposed in a first and second array. Side A of lead frame 12 has a first array of lead fingers 14a and side B of lead frame 12 has a second array of lead fingers 14b. The lead frame 12 is also provided with a die paddle 16 that is positioned between the first and second arrays of lead fingers 14a and 14b such that the lead fingers 14a are pointing toward one side of die paddle 16 and lead fingers 14b are pointing toward the opposite side of die paddle 16.

The lead frame 12 is also provided with a pair of bus bars 20a and 20b. The bus bars 20a and 20b are each connected between two outer lead fingers on each end of sides A and B of lead frame 12. The bus bar 20a extends from one end of side A to the other end and passes between lead fingers 14a and one side of die paddle 16. The bus bar 20b extends from one end of side B to the other end and passes between lead fingers 14b and the other side of die paddle 16. The bus bars are part of the lead frame conductive material and provide ground voltage (Vss) or positive voltage (Vcc).

An integrated circuit semiconductor chip or die 18 is secured to die paddle 16 by a conventional attaching means such as a suitable adhesive. The semiconductor die 18 can be any integrated circuit device. The semiconductor die 18 has a plurality of interconnection areas on an active surface thereof, such as bond pads disposed on an outer surface thereof opposite die paddle 16 along a horizontal axis of semiconductor die 18. As shown in FIG. 1, a first array of bond pads 26a and 27a are disposed along one side of semiconductor die 18, while a second array of bond pads 26b and 27b are disposed on the opposite side of semiconductor die 18. The bond pads 26a, 26b are configured for electrical connection to lead fingers 14a, 14b and bond pads 27a, 27b are configured for electrical connection to bus bars 20a, 20b, by connection members such as bond wires, as discussed in more detail below.

Each of bus bars 20a and 20b include offset sections 22a and 22b that pass by lead fingers 14a and 14b, respectively. As shown in FIG. 1, offset section 22a is formed between bend regions 24a at opposite ends of bus bar 20a, with offset section 22a displaced a predetermined distance from the remaining part of bus bar 20a by bend regions 24a. FIG. 2 illustrates that offset section 22a of bus bar 20a is offset or downset from a first plane $P_1$ to a second plane $P_2$ along a vertical axis Z by bend region 24a. The offset section 22a is displaced a distance D from the remaining part of bus bar 20a. The die paddle 16 and lead fingers 14a, 14b are position the first plane $P_1$ along with the remaining part of bus bar 20a. A similar structure is present for bus bar 20b, in which offset section 22b is formed between bend regions 24b at each end of bus bar 20b, with the remaining part of bus bar 20b disposed in the same plane as lead fingers 14b. The offset section 22b is displaced a predetermined distance from the remaining part of bus bar 20b by bend regions 24b.

The offset sections 22a and 22b provide additional clearance for bonding wires crossing thereover to connect the lead fingers to the semiconductor die. The bend regions 24a and 24b can be formed at different locations along bus bars 20a and 20b to form offset sections 22a and 22b. While FIG. 1 shows one possible location where offset sections 22a and 22b of bus bars 20a and 20b can be formed, other locations may be selected as desired along the bus bars prior to the point where the bus bars pass by lead fingers 14a and 14b.

A conventional wire bonding process can be used to couple connection members such as various bond wires to the semiconductor die and to the lead fingers and bus bars. For example, one end of a bond wire is connected to a bond pad on the semiconductor die, while the other end of the bond wire crosses over a bus bar to make contact with the internal tip end of a lead finger. Other bond wires are connected to different bond pads and to bonding zones on the bus bar.

As shown in FIG. 1, a plurality of bond wires 28a and 28b traverse over offset sections 22a and 22b of the bus bars to electrically couple the lead fingers 14a and 14b to a plurality of bond pads 26a and 26b of semiconductor die 18. For example, one end of a bond wire 28a is attached to the internal tip end of a lead finger 14a. The bond wire 28a passes over bus bar 20a and the other end of bond wire 28a is connected to a corresponding bond pad 26a. The bond wires 28b are connected in a similar manner to bond pads 26b.

A plurality of bond wires 29a and 29b electrically couple the offset sections 22a and 22b of the bus bars to a plurality of selected bond pads 27a and 27b on the semiconductor die 18. For example, one end of a bond wire 29a is connected to a corresponding bond pad 27a. The other end of bond wire 29a is connected to offset section 22a of bus bar 20a at an appropriate target bonding zone. The bond wires 29b are connected in a similar manner to bond pads 27b and target bonding zones on offset section 22b of bus bar 20b. Multiple bond wire contacts may be made to the bus bars to more efficiently distribute voltage if desired.

As shown in FIG. 3, bond wires 29a and 29b coupled to the bus bars have a steeper incline or angle of contact than bond wires 28a and 28b coupled to the lead fingers. This aids in preventing short circuiting between bond wires attached to the lead fingers and adjacent bond wires attached to the bus bar.

An encapsulating material 32 such as a molding compound of a plastic material is formed around the semiconductor die, the bus bars, the bond wires, and an inner portion of the lead frame to provide a protective covering such as a plastic body for these components. A molding compound such as a plastic epoxy can be utilized as the encapsulating material. Low stress mold techniques are used in encapsulating the device in order to prevent damage to the device during molding.

Figure 4:
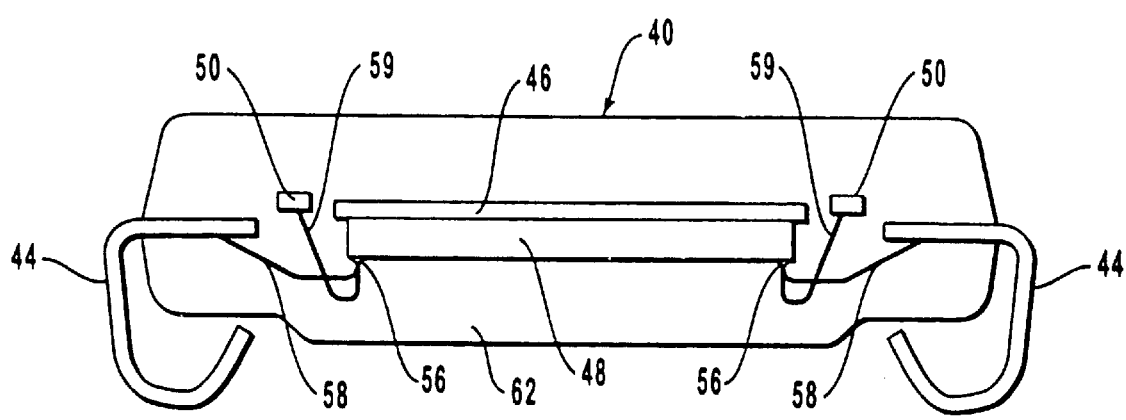
FIG. 4 is a sectional elevation end view of a semiconductor device package according to another embodiment of the invention.

Referring to FIG. 4, a sectional end view of a semiconductor device package 40 according to another embodiment of the present invention is depicted. In this embodiment, the die paddle is also offset with the bus bars along the z-axis from the lead fingers disposed in a first plane. The package 40 is a small outline J-leaded (SOJ) package.

The package 40 includes a lead frame with a plurality of J-shaped lead members such as a first and second array of lead fingers 44. The lead frame is also provided with a die paddle 46 that is positioned between the first and second array of lead fingers 44. A semiconductor die 48 is secured to die paddle 46 by a conventional attaching means. A pair of bus bars 50 are each positioned between lead fingers 44 and opposite sides of die paddle 46.

The semiconductor die 48 includes a plurality of bond pads 56 disposed on an outer surface thereof opposite die paddle 46. The bond pads 56 are configured for electrical connection to lead fingers 44 and bus bars 50 by connection members such as bond wires 58 and 59, respectively. An encapsulating material 62 is formed around the device including an inner portion of lead fingers 44 to provide a protective covering.

As shown in FIG. 4, bus bars 50 include sections that are offset from a first plane, where the inner portion of lead fingers 44 are positioned, to a second plane along a vertical z-axis, similar to the embodiment shown in FIG. 3. The offset sections of bus bars 50 are positioned on the second plane away from semiconductor die 48. In addition, die paddle 46 is offset from the first plane along the vertical z-axis toward bus bars 50.

The bond wires 58 traverse over the offset sections of bus bars 50 to electrically couple lead fingers 44 to bond pads 56 of semiconductor die 48. The bond wires 59 electrically couple bus bars 50 to other bond pads on semiconductor die 48. As depicted in FIG. 4, bond wires 59 coupled to bus bars 50 have a steeper incline or angle of contact than bond wires 58 coupled to lead fingers 44.

It should be understood that either of the above embodiments of the invention can be employed in SOJ or TSOP packages, as well as all other semiconductor packages known to those skilled in the art.

In a method for fabricating a semiconductor device package according to the present invention, a lead frame is formed including a plurality of lead members positioned in an array such as a first array of lead fingers and a second array of lead fingers on a first plane along a vertical z-axis.

A die paddle is attached to the lead frame so as to be adjacent to the lead members, such as by being positioned between the first and second array of lead fingers. The die paddle can be attached so as to be on the first plane along the vertical z-axis, or the die paddle can be attached so as to be offset from the first plane along the vertical z-axis. One or more bus bars such as a pair of bus bars is formed on the lead frame, with the bus bars positioned between the lead members and the die paddle. Each bus bar is compressed or bent to produce a section thereof passing by the lead members that is displaced to a second plane offset from the first plane along the vertical z-axis.

A semiconductor chip or die is then provided having a plurality of bond pads thereon, and the chip or die is secured to the die paddle. A first plurality of connection members such as bond wires are attached to the semiconductor die bond pads and the lead members such that the first plurality of connection members traverse over the offset sections of the bus bars without contacting the bus bars. A second plurality of connection members is attached to other semiconductor die bond pads and the offset sections of the bus bars such that the connection members attached to the bus bars have a steeper incline than the connection members attached to the lead members. The semiconductor die, the bus bars, the first and second plurality of connection members, and an inner portion of the lead frame are then encapsulated with a protective material.

The present invention provides many advantages and benefits in forming a semiconductor device package. An undesirable wire sweep during package fabrication can result in a bond wire attached to a lead finger touching the bus bar, thereby causing an undesirable short. The present invention has the advantage of minimizing the possibility of bond wires making unwanted contact with the bus bars by offsetting or downsetting the bus bars. The offset sections of the bus bars in the present invention provide additional clearance for bonding wires that traverse over the bus bars that are connected between the die bond pads and lead fingers of the lead frame, thus reducing the risk of wires shorting to the bus bars.

In addition, the method of the present invention is simpler and less expensive than prior methods in that a conventional wire bonding operation is performed during packaging fabrication. The bus bar in the present invention is simply offset or downset from its typical position by a conventional bending operation performed by the lead frame supplier.

Semiconductor devices in thin packages have certain needs. Since, longer bonding wires make it more difficult to reduce the size and thickness of semiconductor devices, shorter bond wires with very low loop height are required to fabricate very thin packages. The offset bus bars of the present invention allow shorter bond wires with low loop heights to be used. The shorter bond wires have less sweep during fabrication, providing better reliability against shorting or grounding. In addition, shorter wires have less inductance than longer wires. This results in a faster device and better signal integrity with less attenuation. Therefore, the present invention provides a device that is going to operate faster. Shorter wires also are less expensive to use than longer wires, thus reducing manufacturing costs.

Further, in the present invention the lead fingers are positioned in the lead frame to be generally perpendicular to the offset section of the bus bar. This is an improvement over prior techniques, since there is more room to route the leads and overall wire lengths can be reduced. The present invention also allows a semiconductor device to be more easily fabricated since the bond wires that go to the bus bar are easier to place thereon. There is also a larger wire bonding process margin due to more area to attach the bond wires on the bus bar, which results in less defects.

In contrast to prior approaches, the sections of the bus bars in the present invention that are offset such as by being downset include the target bonding zones on the bus bars. In prior approaches, portions of the bus bars have been recessed to avoid bonding wires attached to lead fingers, but the target bonding zones on the bus bars have been placed back up in the same plane as the other leads. In the present invention, by having the target bonding zones on the offset sections of the bus bars, better bond wire densities can be achieved.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by united states Letters Patent is:

1. A method for fabricating a semiconductor device package, comprising the steps of:
   forming a lead frame including a plurality of lead members positioned in an array on a first plane along a vertical axis;
   attaching a die paddle to the lead frame adjacent to the lead members;
   forming at least one bus bar on the lead frame positioned between the lead members and the die paddle;
   compressing the bus bar to produce a section thereof passing by the lead members that is offset from the first plane to a second plane along the vertical axis;
   securing a semiconductor die to the die paddle;
   attaching a first plurality of connection members to the semiconductor die and the lead members such that the first plurality of connection members traverse over the offset section of the bus bar without contacting the bus bar; and
   attaching a second plurality of connection members to the semiconductor die and the offset section of the bus bar.

2. The method of claim 1, wherein the connection members attached to the bus bar have a steeper incline than the connection members attached to the lead members.

3. The method of claim 1, further comprising the step of encapsulating the semiconductor die, the bus bar, the first and second plurality of connection members, and an inner portion of the lead frame with a protective material.

4. The method of claim 1, wherein the die paddle is attached so as to be on the first plane along the vertical axis.

5. The method of claim 1, wherein the die paddle is attached so as to be offset from the first plane along the vertical axis toward the second plane.

6. The method of claim 1, wherein the offset section of the bus bar is positioned on the second plane away from the semiconductor die.

7. A method for fabricating a semiconductor device package, comprising the steps of:
   providing a semiconductor die having a first and second plurality of bond pads thereon;
   forming a lead frame including a first array of lead fingers and a second array of lead fingers positioned on a first plane along a z-axis;

attaching a die paddle to the lead frame so that the die paddle is positioned between the first and second array of lead fingers;

forming a pair of bus bars on the lead frame, the bus bars positioned between the lead fingers and the die paddle;

compressing the bus bars to produce sections thereof passing by the lead fingers that are offset from the first plane to a second plane along the z-axis;

securing the semiconductor die to the die paddle;

attaching a first plurality of bond wires to the first plurality of bond pads and the lead fingers such that the first plurality of bond wires traverse over the offset sections of the bus bars without contacting the bus bars;

attaching a second plurality of bond wires to the second plurality of bond pads and the offset sections of the bus bars; and encapsulating the semiconductor die, the bus bars, the first and second plurality of bond wires, and an inner portion of the lead frame with a protective material.

8. The method of claim 7, wherein the bond wires attached to the bus bars have a steeper incline than the bond wires attached to the lead fingers.

9. The method of claim 7, wherein the die paddle is attached so as to be on the first plane along the z-axis.

10. The method of claim 7, wherein the die paddle is attached so as to be offset from the first plane along the z-axis toward the second plane.

11. The method of claim 7, wherein the offset sections of the bus bars are positioned on the second plane away from the semiconductor die.

12. A method for producing a lead frame for a semiconductor device package, comprising the steps of:

forming a plurality of lead members positioned in an array on a first plane along a vertical axis;

forming a die paddle adjacent to the lead members;

forming at least one bus bar positioned between the lead members and the die paddle; and compressing a section of the bus bar passing by the lead members to displace the section to a second plane offset along the vertical axis from the first plane.

13. The method of claim 12, wherein the die paddle is formed to be on the first plane along the vertical axis.

14. The method of claim 12, wherein the die paddle is formed to be offset from the first plane along the vertical axis toward the second plane.

* * * * *

UNITED STATES PATENT AND TRADEMARK OFFICE
CERTIFICATE OF CORRECTION

PATENT NO. : 6,008,073
DATED : Dec. 28, 1999
INVENTOR(S): Jerrold L. King; David J. Corisis It is certified that error appears in the above-identified patent and that said Letters Patent is hereby corrected as shown below:

Col. 1, line 20, after "descreases" change "requires" to --require--

Col. 4, line 53, after "14a" insert --and 14b--

Col. 5, line 25, after "are" change "position" to --positioned on--

Signed and Sealed this

Twenty-seventh Day of March, 2001

Attest:

NICHOLAS P. GODICI

Attesting Officer

Acting Director of the United States Patent and Trademark Office